(12) United States Patent
Kunnen et al.

(10) Patent No.: US 11,300,890 B2
(45) Date of Patent: *Apr. 12, 2022

(54) LITHOGRAPHIC APPARATUS, SUPPORT TABLE FOR A LITHOGRAPHIC APPARATUS AND DEVICE MANUFACTURING METHOD

(71) Applicant: ASML NETHERLANDS B.V., Veldhoven (NL)

(72) Inventors: Johan Gertrudis Cornelis Kunnen, Weert (NL); Johannes Henricus Wilhelmus Jacobs, Heeze (NL); Coen Cornelis Wilhelmus Verspaget, Helmond (NL); Ronald Van Der Ham, Maarheeze (NL); Ivo Adam Johannes Thomas, Son (NL); Martijn Houben, 's-Hertogenbosch (NL); Thibault Simon Mathieu Laurent, Eindhoven (NL); Gregory Martin Mason Corcoran, Eindhoven (NL); Ruud Hendrikus Martinus Johannes Bloks, Helmond (NL); Gerben Pieterse, Eindhoven (NL); Pieter Lein Joseph Gunter, Weert (NL); Marinus Jan Remie, Eindhoven (NL); Sander Catharina Reinier Derks, Budel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,924

(22) Filed: Dec. 20, 2019

(65) Prior Publication Data
US 2020/0124993 A1  Apr. 23, 2020

Related U.S. Application Data

(63) Continuation of application No. 15/932,215, filed on Feb. 16, 2018, now Pat. No. 10,520,837, which is a
(Continued)

(51) Int. Cl.
*G03F 7/20* (2006.01)

(52) U.S. Cl.
CPC ...... *G03F 7/70875* (2013.01); *G03F 7/70341* (2013.01)

(58) Field of Classification Search
CPC ............. G03F 7/70341; G03F 7/70875; G03F 7/2041; H01L 21/0274; H01L 21/683
See application file for complete search history.

(56) References Cited

U.S. PATENT DOCUMENTS

| 4,503,335 A | 3/1985 | Takahashi |
| 4,509,852 A | 4/1985 | Tabarelli et al. |

(Continued)

FOREIGN PATENT DOCUMENTS

| CN | 1637610 | 7/2005 |
| CN | 102023495 | 4/2011 |

(Continued)

OTHER PUBLICATIONS

Japanese Office Action dated Aug. 26, 2013 in corresponding Japanese Patent Application No. 2012-167085.
(Continued)

*Primary Examiner* — Deoram Persaud
(74) *Attorney, Agent, or Firm* — Pillsbury Winthrop Shaw Pittman, LLP

(57) ABSTRACT

A support table configured to support a substrate, the support table having a support section to support a substrate and a conditioning system to supply heat energy to and/or remove heat energy from the support section, wherein the condi-
(Continued)

tioning system comprises a plurality of conditioning units that are independently controllable.

20 Claims, 6 Drawing Sheets

Related U.S. Application Data continuation of application No. 13/586,728, filed on Aug. 15, 2012, now Pat. No. 9,897,923.

(60) Provisional application No. 61/524,960, filed on Aug. 18, 2011.

(56) References Cited

U.S. PATENT DOCUMENTS

| | | | |
|---|---|---|---|
| 5,001,423 | A | 3/1991 | Abrami |
| 5,034,688 | A | 7/1991 | Moulene |
| 5,873,769 | A | 2/1999 | Chiou |
| 5,881,208 | A | 3/1999 | Geyling |
| 6,072,162 | A | 6/2000 | Ito |
| 6,359,457 | B1 | 3/2002 | Kund |
| 6,605,955 | B1 | 8/2003 | Costello |
| 7,304,715 | B2 | 12/2007 | Cadee et al. |
| 7,433,016 | B2 | 10/2008 | Streefkerk et al. |
| 8,502,960 | B2 | 8/2013 | Brinkhof et al. |
| 8,564,763 | B2 | 10/2013 | Jacobs et al. |
| 8,614,784 | B2 | 12/2013 | Riepen et al. |
| 10,359,320 | B2 | 7/2019 | Nogami et al. |
| 2002/0002944 | A1 | 1/2002 | Shirley |
| 2003/0114077 | A1 | 6/2003 | Yang |
| 2004/0187787 | A1 | 9/2004 | Dawson et al. |
| 2004/0207824 | A1 | 10/2004 | Lof et al. |
| 2005/0046813 | A1 | 3/2005 | Streefkerk et al. |
| 2005/0146694 | A1 | 7/2005 | Tokita |
| 2006/0033892 | A1 | 2/2006 | Cadee et al. |
| 2006/0033898 | A1 | 2/2006 | Cadee |
| 2006/0038968 | A1 | 2/2006 | Kemper et al. |
| 2006/0096972 | A1 | 5/2006 | Nakamura |
| 2006/0158627 | A1 | 7/2006 | Kemper et al. |
| 2007/0070316 | A1 | 5/2007 | Ehrmann et al. |
| 2007/0153244 | A1* | 7/2007 | Maria Zaal ......... G03F 7/70341 355/30 |
| 2007/0224839 | A1 | 9/2007 | Shimizu |
| 2008/0137055 | A1 | 6/2008 | Hennus |
| 2008/0158526 | A1 | 7/2008 | Hennus et al. |
| 2008/0212046 | A1 | 9/2008 | Riepen et al. |
| 2008/0304025 | A1 | 12/2008 | Chang et al. |
| 2009/0075012 | A1 | 3/2009 | Van Dijk |
| 2009/0254226 | A1 | 10/2009 | Iwanaga et al. |
| 2009/0279060 | A1 | 11/2009 | Direcks et al. |
| 2009/0279061 | A1 | 11/2009 | Jacobs et al. |
| 2009/0279062 | A1 | 11/2009 | Direcks et al. |
| 2010/0045951 | A1 | 2/2010 | Martens et al. |
| 2010/0210041 | A1 | 8/2010 | Chang et al. |
| 2010/0277709 | A1 | 11/2010 | Stavenga |
| 2011/0007288 | A1 | 1/2011 | Brinkhof et al. |
| 2011/0090472 | A1 | 4/2011 | Riepen et al. |
| 2011/0222033 | A1 | 9/2011 | Ten Kate et al. |
| 2012/0013865 | A1 | 1/2012 | Laurent |
| 2012/0019792 | A1 | 1/2012 | Novak et al. |
| 2012/0307216 | A1 | 12/2012 | Laurent |
| 2013/0094005 | A1 | 4/2013 | Kunnen |
| 2014/0356985 | A1 | 12/2014 | Ricci |
| 2016/0027678 | A1 | 1/2016 | Parkhe |

FOREIGN PATENT DOCUMENTS

| | | |
|---|---|---|
| CN | 102064086 | 5/2011 |
| EP | 1 420 298 | 5/2004 |
| JP | H06-053298 | 2/1994 |
| JP | 2005-197447 | 7/2005 |
| JP | 2005-315707 | 11/2005 |
| JP | 2007-258286 | 10/2007 |
| JP | 2008-262963 | 10/2008 |
| JP | 2009-105443 | 5/2009 |
| JP | 2009-272631 | 11/2009 |
| JP | 2011-023716 | 2/2011 |
| KR | 10-2007-0039894 | 4/2007 |
| TW | 2005-27162 | 8/2005 |
| WO | 99/49504 | 9/1999 |
| WO | 2005 /124835 | 12/2005 |
| WO | 2008/005871 | 1/2008 |

OTHER PUBLICATIONS

European Search Report dated Nov. 15, 2012 in corresponding European Patent Application No. 12180596.4.
Chinese Office Action dated Apr. 25, 2014 in corresponding Chinese Patent Application No. 201210292390.5.
Japanese Office Action dated May 31, 2016 in corresponding Japanese Patent Application No. 2015-003993.
Notification of Reasons for Refusal issued in corresponding Korean Patent Application No. 10-2015-0089792 dated Nov. 10, 2017 with English translation.
English translation of Notification of Reasons for Refusal dated May 28, 2018 issued in corresponding Korean Patent Application No. 10-2015-0089792.

* cited by examiner

LITHOGRAPHIC APPARATUS, SUPPORT TABLE FOR A LITHOGRAPHIC APPARATUS AND DEVICE MANUFACTURING METHOD

This application is a continuation of U.S. patent application Ser. No. 15/932,215, filed Feb. 16, 2018, now allowed, which is a continuation of U.S. patent application Ser. No. 13/586,728, filed Aug. 15, 2012, now U.S. Pat. No. 9,897,928, which claims priority and benefit under 35 U.S.C. § 119(e) to U.S. Provisional Patent Application No. 61/524,960, filed on Aug. 18, 2011. The entire content of each of the foregoing applications is incorporated herein in its entirety by reference.

FIELD

The present invention relates to a lithographic apparatus, a support table for a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Utilizing immersion fluid in a lithographic apparatus may introduce certain difficulties. For example, the use of immersion fluid may result in an additional heat load within the lithographic apparatus, which may affect the accuracy of formation of an image on a substrate.

In some instances the heat load may be non-uniform across a substrate, resulting in non-uniform variation of the image. By way of example, a heat load may be caused by operation of a fluid handling system and/or by evaporation of the immersion fluid. These effects may be localized to a part of a substrate. Consequently, there may be a localized temperature change in the substrate, resulting in a localized thermal expansion or contraction of the substrate. This is turn may result in a localized variation in a overlay error and/or critical dimension (CD).

It is desirable, for example, to provide a system in which the effect of a localized heat load can be reduced.

According to an aspect of the invention, there is provided a support table, for a lithographic apparatus, configured to support a substrate, the support table comprising: a support section, configured to support a lower surface of a substrate on an upper face thereof; and a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section and each of the conditioning regions configured such that it corresponds to a section of the upper face of the support section having an area within a range of from approximately 50% to approximately 350% of the area of the substrate in contact with an immersion fluid provided by a fluid handling structure and having an aspect ratio of between 1 and approximately 2.

According to an aspect of the invention, there is provided a support table, for a lithographic apparatus, configured to support a substrate, the support table comprising: a support section, configured to support a lower surface of a substrate on an upper face thereof; a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section; a plurality of temperature sensors, configured to measure the temperature of the support table at a respective location; and a controller, configured to control the conditioning system based on the measurement data from the temperature sensors.

According to an aspect of the invention, there is provided a support table, for a lithographic apparatus, configured to support a substrate, the support table comprising: a support section, configured to support a lower surface of a substrate on an upper face thereof; and a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section, wherein each of the conditioning units comprises a channel within the corresponding conditioning region, the channel configured to convey a conditioning fluid.

According to an aspect of the invention, there is provided a support table, for a lithographic apparatus, configured to support a substrate in a recess, the support table comprising: a support section, configured to support a lower surface of a substrate on an upper face thereof; a first conditioning system, configured to supply heat energy to and/or remove heat energy from the support section, the first conditioning system comprising a plurality of conditioning units that are independently controllable, each of the conditioning units configured to supply heat energy to and/or remove heat energy from a respective conditioning region of the support section; and a second conditioning system, configured to supply heat energy to and/or remove heat energy from a region of the support table adjacent a gap between the edge of the recess and the edge of the substrate, the second conditioning system comprising a plurality of independently controllable conditioning units, each configured to supply heat energy to and/or remove heat energy from a respective region of the support table adjacent a respective segment of the gap.

According to an aspect of the invention, there is provided a support table, for a lithographic apparatus, configured to support a substrate in a recess, the support table comprising: a support section, configured to support a lower surface of a substrate on an upper face thereof; a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section; and an extraction system, configured to extract immersion liquid from a gap between the edge of the recess and the edge of the substrate, the extraction system comprising a plurality of independently controllable extraction units, each configured to extract immersion liquid from a respective segment of the gap.

According to an aspect of the invention, there is provided a support table, for a lithographic apparatus, configured to support a substrate, the support table comprising: a support section, configured to support a lower surface of a substrate on an upper face thereof, the support section comprising a plurality of support table sections mechanically connected to each other by a connector, each of the support table sections corresponding to a respective conditioning region; and a conditioning system, configured to supply heat energy to and/or remove heat energy from the support section, the conditioning system comprising a plurality of conditioning units that are independently controllable, each of the conditioning units configured to supply heat energy to and/or remove heat energy from its respective conditioning region of the support section.

According to an aspect of the invention, there is provided a device manufacturing method comprising: projecting a patterned beam of radiation through an immersion liquid provided by a fluid handling structure to a space between a projection system and a substrate supported on an upper surface of a support section of a support table; using a conditioning system to supply heat energy to and/or remove heat energy from the support section, the conditioning system comprising a plurality of conditioning units, each configured to supply heat energy to and/or remove heat energy from a respective conditioning region of the support section, each of the conditioning regions corresponding to a section of the upper face of the support section having an area within a range of from approximately 50% to approximately 350% of the area of the substrate in contact with immersion fluid provided by the fluid handling structure and having an aspect ratio of between 1 and approximately 2; and controlling each of the conditioning units independently.

According to an aspect of the invention, there is provided a device manufacturing method comprising: projecting a patterned beam of radiation through an immersion liquid to a space between a projection system and a substrate supported on a support section of a support table; using a conditioning system to supply heat energy to and/or remove heat energy from the support section, the conditioning system comprising a plurality of conditioning units that are independently controllable, each conditioning unit configured to supply heat energy to and/or remove heat energy from a respective conditioning region of the support section; and controlling the conditioning system based on measurement data from a plurality of temperature sensors, each configured to measure the temperature of the support table at a respective location.

According to an aspect of the invention, there is provided a method of generating calibration correction data for a plurality of temperature sensors, each configured to measure the temperature of a support table in a lithographic apparatus, the method comprising: substantially simultaneously obtaining measurement data from the temperature sensors; determining temperature data for each temperature sensor based on the measurement data and existing calibration data for each temperature sensor; determining for each temperature sensor a deviation of its temperature data from the mean temperature data for the plurality of temperature sensors; and determining calibration correction data for each temperature sensor that corresponds to the determined deviation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
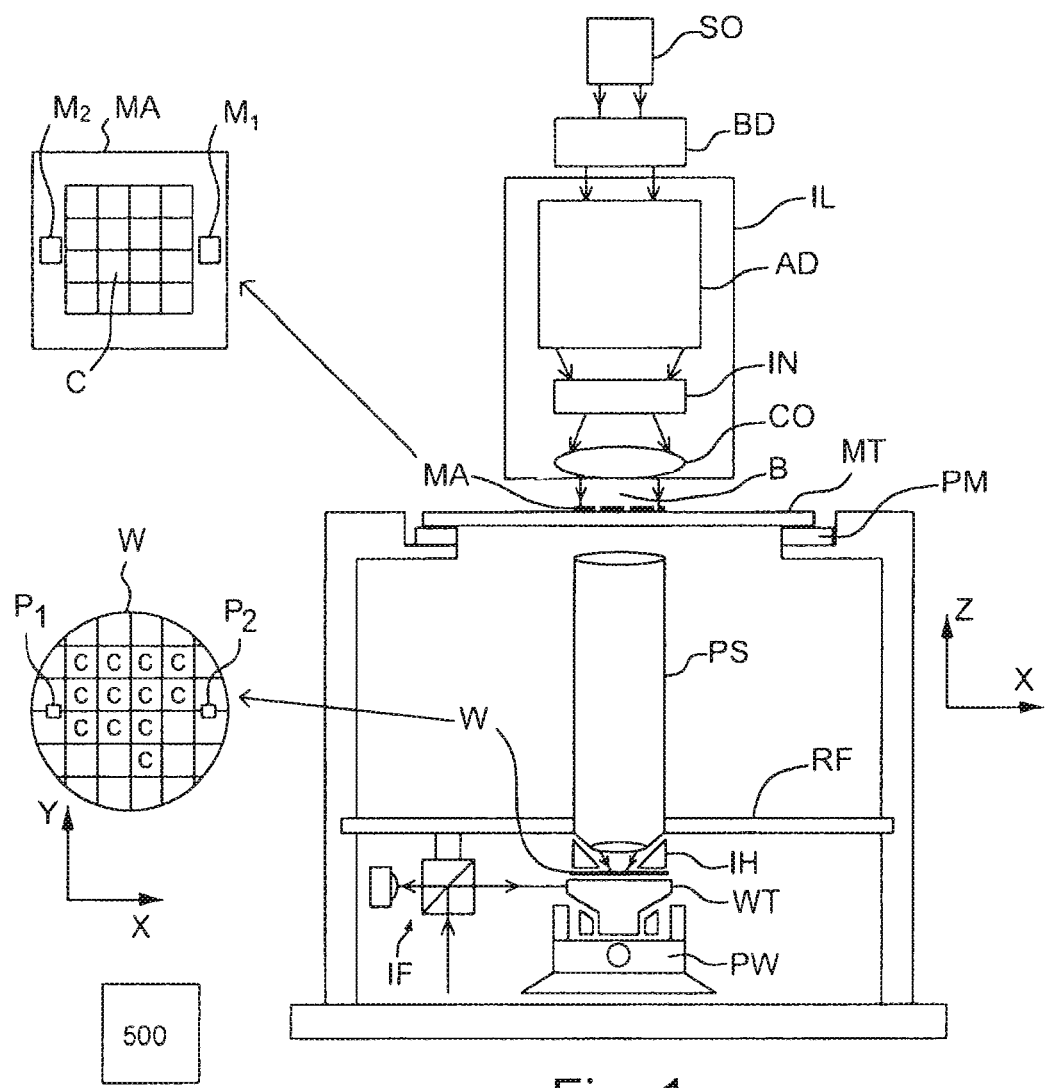
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
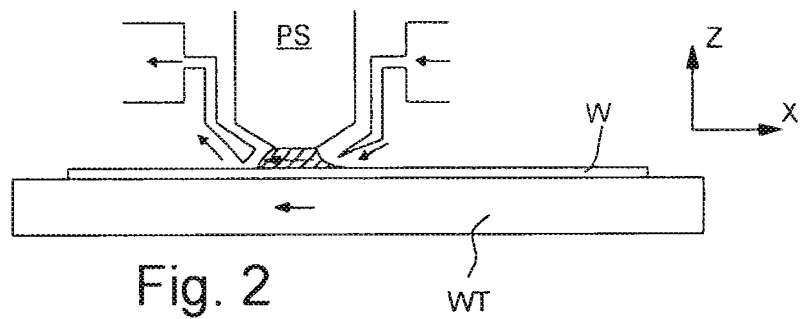
FIGS. 2 and 3 depict a liquid supply system for use in a lithographic projection apparatus.
Figure 3:
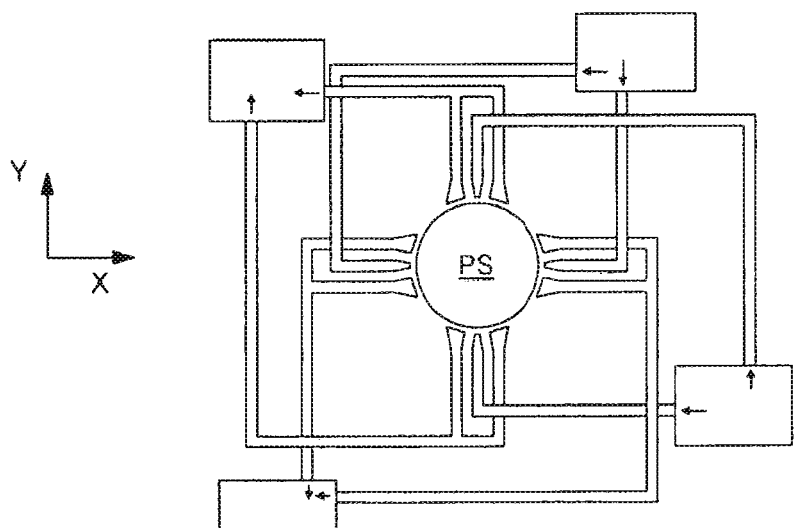

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
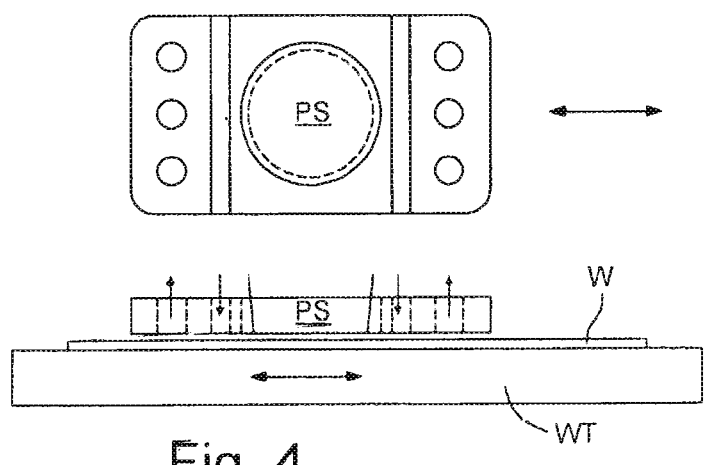
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Figure 5:
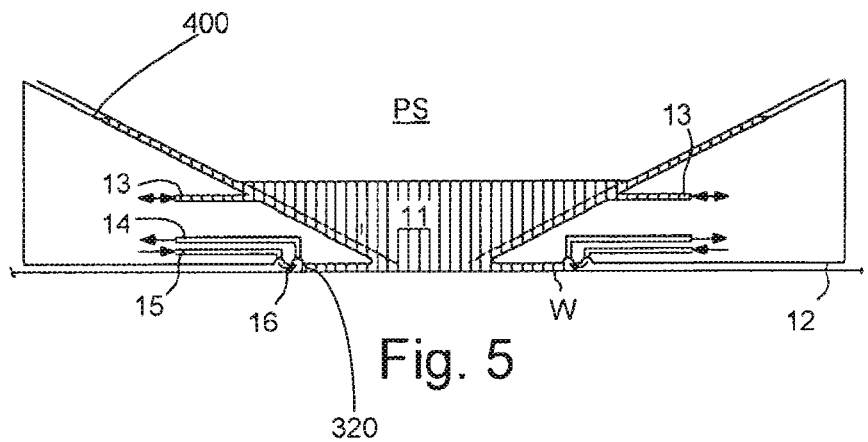
FIG. 5 depicts a further liquid supply system for use in a lithographic projection apparatus.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Figure 6:
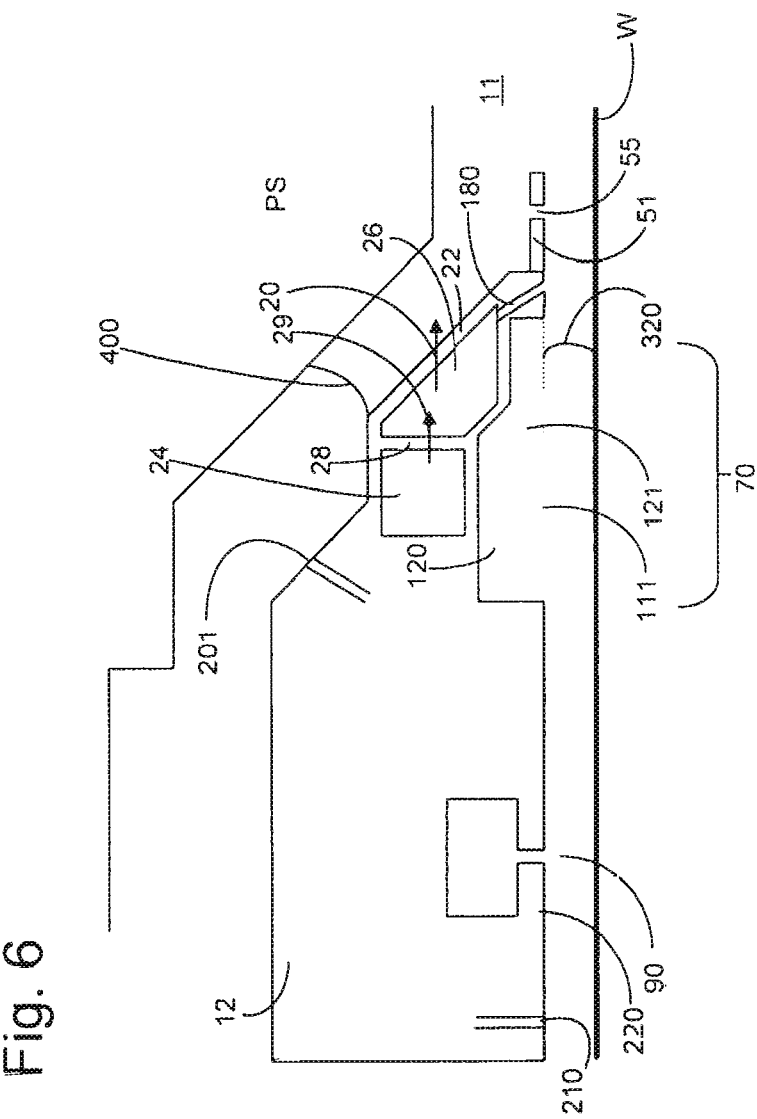
FIG. 6 depicts, in cross-section, a further liquid supply system for use in a lithographic projection apparatus.

FIG. 6 illustrates a fluid handling structure 12 which is part of a liquid supply system. The fluid handling structure 12 extends around the periphery (e.g. circumference) of the final element of the projection system PS.

A plurality of openings 50 in the surface which in part defines the space 11 provides the liquid to the space 11. The liquid passes through openings 29, 50 in side walls 28, 52 respectively through respective chambers 54, 56 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An underpressure in chamber 121 is chosen such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain high relative to the structure 12.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Within a lithographic apparatus, a substrate may be supported on a support table. In particular, the support table may include a support section that is configured to support a lower surface of the substrate. An upper face of the support section may, for example, include a base surface having a plurality of burls protruding from base surface. The lower surface of the substrate may be supported on the upper faces of the burls. Such an arrangement may minimize or reduce the total area of the substrate in contact with the support table, minimizing or reducing the likelihood of contaminants being transferred between the support table and the substrate and/or minimizing or reducing the likelihood of a contaminant being located between the substrate and its support on the support table, which may result in a deformation of the substrate.

In an embodiment, the space around the burls, below the substrate, may be connected to an under-pressure source. Accordingly, the substrate may be vacuum clamped to the support table.

In the event of a local heat load acting on the substrate and/or the support table, there may be a local temperature variation within, for example, the substrate, resulting in a local thermal expansion or thermal contraction, most significantly in a direction parallel to the upper and lower major faces of the substrate. However, the thermal expansion and/or thermal contraction of the substrate may be resisted by the support table, to which the substrate is clamped. In particular, the forces to resist the thermal expansion and/or thermal contraction may be applied to the substrate via the burls.

In order to reduce or minimize temperature change within a substrate, a conditioning system may be provided that supplies heat energy to and/or removes heat energy from the support section of the support table. Accordingly, heat can be supplied or removed in order to compensate for a heat load on the substrate and/or support table. The conditioning system may provide heat directly to or remove heat directly from the support section to compensate for a heat load on the support table. Furthermore, the conditioning system may provide heat to or remove heat from the support section such that heat flows from the support section to the substrate, or from the substrate to the support section, in order to compensate for a heat load on the substrate.

Figure 7:
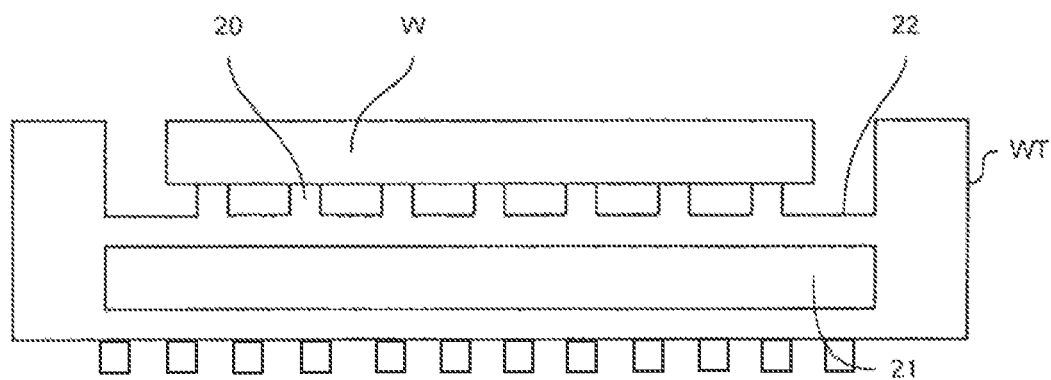
FIG. 7 depicts, in cross-section, a support table that may be used with an embodiment of the invention.

FIG. 7 schematically depicts a support table WT in which an embodiment of the invention may be provided. The embodiment depicted in FIG. 7 is simplified and features of a substrate table not required to explain an embodiment of the present invention are not depicted. Nevertheless, a support table of an embodiment of the present invention may include many such additional features.

As shown, the support table WT may include a support section 22 that is configured to support a substrate W. In particular, the substrate W may be supported by means of a plurality of burls 20. The support table WT further includes a conditioning system 21 that supplies heat energy to and/or removes heat energy from the support section 22.

The substrate W is thermally coupled to the support section 22, for example by means of heat conduction through the burls 20 that are in physical contact with the lower surface of the substrate W. In other words, when the conditioning system 21 supplies heat energy to or removes heat energy from the support section 22, energy in turn transfers from the support section to the substrate or to the support section from the substrate, respectively.

Figure 8:
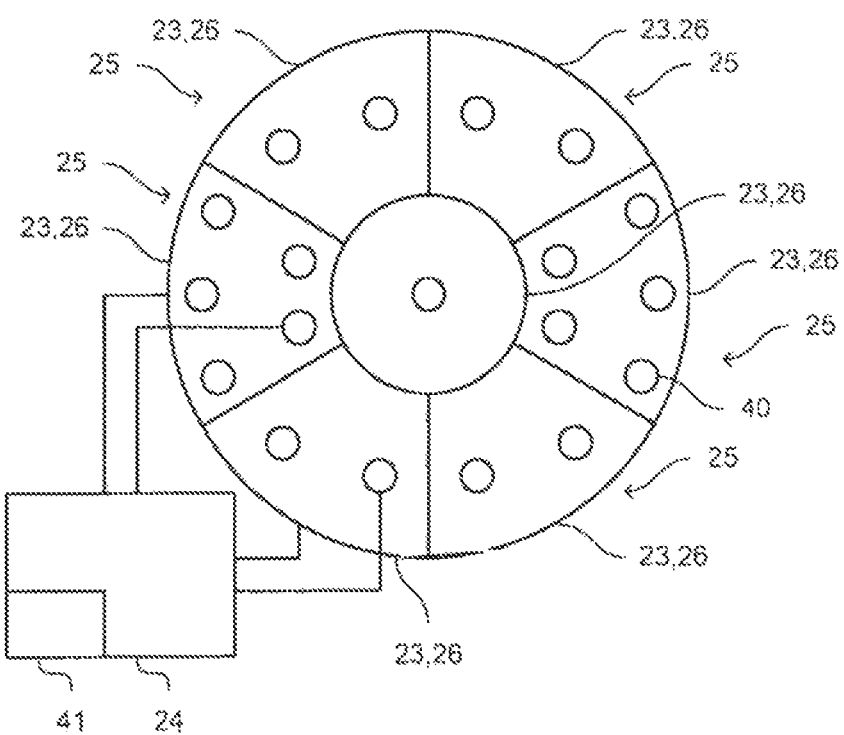
FIG. 8 depicts, in plan view, part of a support table that may be used with an embodiment of the invention.

In an embodiment, depicted in FIG. 8, the conditioning system 21 may include a plurality of independently controllable conditioning units 23. Each may be connected to a controller 24, for example by control lines (which, for clarity, are not all depicted in FIG. 8). Each of the individually controllable conditioning units 23 may be configured such that it can supply heat energy to and/or remove heat energy from the support section 22 of the support table WT.

Each of the individually controllable conditioning units 23 may be configured to supply heat energy to and/or remove heat energy from a respective conditioning region of the support section 22. Accordingly, the controller 24 may control the conditioning system 21 more effectively to respond to a local heat load on the substrate W.

For example, if there is localized cooling on the substrate W, the controller 24 may control the conditioning system 21 such that one individually controllable conditioning unit 23 provides heat to a portion of the support section 22 that is adjacent the region of the substrate W in which the localized heat load is provided.

This may avoid heating the entirety of the support section 22 of the support table WT in response to a localized heat load on the substrate W. This, in turn, may avoid or reduce a problem for a conditioning system that is not divided into separate conditioning regions, namely that the temperature of a section of a substrate W not subject to a localized heat load may be unnecessarily raised. Furthermore, by configuring the conditioning system 21 as discussed above so that a localized response can be provided to a localized heat load, a faster response may be available. This is because, as previously discussed, the risk of elevating the temperature of a region of the substrate W not subject to a localized heat load, for example by providing a large amount of heat energy locally to reduce the response time, is reduced.

In an embodiment, the conditioning system 21 may be configured such that a conditioning region 25 associated with each of the individually controllable conditioning units 23 roughly matches the footprint of an expected localized heat load on the substrate W.

The expected localized heat load may, for example, be provided by a fluid handling structure 12 within an immersion lithographic apparatus. The fluid handling structure 12 may provide immersion fluid to an area of the upper surface of the substrate W when it is supported by the support table WT.

In an embodiment, the conditioning system 21 may be configured such that each of the individually controllable conditioning units 23 is associated with a conditioning region 25 that has a similar area to the area of the fluid handling structure 12 and a similar aspect ratio. By arranging the conditioning regions 25 to largely correspond to the localized heat load caused by the use of the fluid handling structure 12, the conditioning system 21 may be configured to respond quickly to the localized heat load with minimal impact on a region of the substrate W that is not directly affected by the localized heat load.

In an embodiment, the conditioning system 21 may be configured such that each of the conditioning regions 25 corresponds to a section of the upper face of the support section 22 having an area within a range of from approximately 50% to approximately 350% of the area of the substrate in contact with the immersion fluid provided by the fluid handling structure 12. This may be known as the "wet footprint". By arranging the conditioning unit 25 to be within this range, the conditioning system 21 may be suitably responsive to the localized heat load. However, the selection of the size of the conditioning regions 25 (and therefore the number of conditioning regions 25 into which the conditioning system 21 is divided) is a compromise. The larger the size of the conditioning regions 25, the slower the conditioning system 21 may respond to the localized heat load and/or the greater the effect on a region of the substrate W that is not directly affected by the localized heat load. On the contrary, reducing the size of the conditioning regions 25 involves the use of a greater number of conditioning regions 25. This may improve the control of the response of the conditioning system 21 to the localized heat load and/or may reduce the effect on a region of the substrate W that is not directly affected by the localized heat load. However, providing a greater number of conditioning regions 25 may involve a more complicated control system and/or may involve a greater number of temperature sensors in order to provide suitable control of the individually controllable conditioning unit 23 associated with each of the conditioning regions 25. The above range represents the range in which this compromise is considered to be acceptable.

In an embodiment, the area may be within a range of approximately 50% to approximately 150% of the wet footprint. Arranging the conditioning system 21 such that the size of the conditioning regions 25 is within this reduced range compared to the range identified above may provide a conditioning system 21 with improved characteristics. In particular, the conditioning system 21 may be able to respond more quickly to a localized heat load and/or may have reduced effect on a region of the substrate W that is not directly affected by the localized heat load while still having a control system for the conditioning system 21 with an acceptable level of complexity, namely avoiding undesirable additional costs.

In an embodiment, each of the conditioning regions 25 may correspond to a section of the upper face of the support section 22 that has an aspect ratio, namely the ratio of the length to the width, of between 1 and approximately 2. The fact that the conditioning regions 25 may have an aspect ratio of between 1 and approximately 2 does not impose a limitation on the particular shapes that each of the conditioning regions 25 may have but merely specifies that the length of any shape may not be more than approximately twice the width of such a shape. Therefore, the wet footprint, which may have a similar aspect ratio, may substantially overlap a conditioning region 25 when aligned with a particular conditioning region 25. For clarity, this situation may be compared with the use of a hypothetical elongate conditioning region. If such an elongate conditioning region has the same area as the wet footprint but is very much longer than it is wide, only a small proportion of the elongate conditioning region may overlap with the wet footprint at any one time. This may prevent a conditioning system composed of such elongate conditioning region from responding quickly to the localized heat load without having a significant effect on a region of the substrate W that is not directly affected by the localized heat load.

In an embodiment, the conditioning system 21 may be configured such that one of the conditioning regions 25 is provided as a substantially circular zone at the center of the support section 22 of the support table WT. The one or more remaining conditioning regions 25 may be arranged as one or more sections of the remaining annulus of the support section 22.

The size of the conditioning region 25 at the center of the support section 22 and the number of sections into which the remaining annulus of the support section 22 may be divided may be appropriately selected such that the size and aspect ratio of each of the conditioning regions 25 appropriately matches each other and the size of the localized heat load.

In an embodiment, as depicted in FIG. 8, the conditioning system 21 may be configured such that there is one conditioning region 25 in the center of the support section 22 and six conditioning regions 25 surrounding it. This arrangement may be particularly beneficial for a particular combination of a size of the support table WT and size of wet footprint provided by a fluid handling structure 12. Other arrangements may be used, for example, if a larger support table WT were used in order to accommodate a larger substrate W.

In an embodiment, as shown in FIG. 8, each of the individually controllable conditioning units 23 may include an electric heater 26, each controlled independently by the controller 24. The electric heater 26 may be provided within the support table WT and/or on a top surface of the support table WT and/or on a lower surface of the support table WT and/or at an edge of the support table WT. In the latter case, one or more electric heaters 26 may be arranged, for example, in a way similar to as described in U.S. Patent Application Publication No. US2009/0279061, the content of which is hereby incorporated in its entirety by reference. An electric heater 26 provided on the upper surface of the support table WT may, for example, be provided in between the burls 20 on the upper surface of the support section 22. In an embodiment, the support table WT may further include burls on its lower surface (an example of which is depicted in FIG. 7). In that case, an electric heater 26 may be provided on the lower surface in between the burls on the lower surface. For completeness, the arrangement of burls on the lower surface of the support table WT may be different from the arrangement of the burls 20 provided on the support section 22 to support the lower surface of the substrate W. In particular, the burls on the lower surface of the support table WT may be more widely spaced than the burls 20 provided on the support section 22 to support the lower surface of the substrate W.

Any convenient arrangement of an electric heater may be provided. For example, the electric heater 26 of each of the individually controllable conditioning units 23 may include a resistive heating element arranged to follow a path covering a plurality of areas within the conditioning region 25. In an embodiment, thin film heaters may be used. A thin film heater may comprise a heating element formed as a thin layer for example. The thin film heaters may be applied by glue or as a coating for example.

Figure 9:
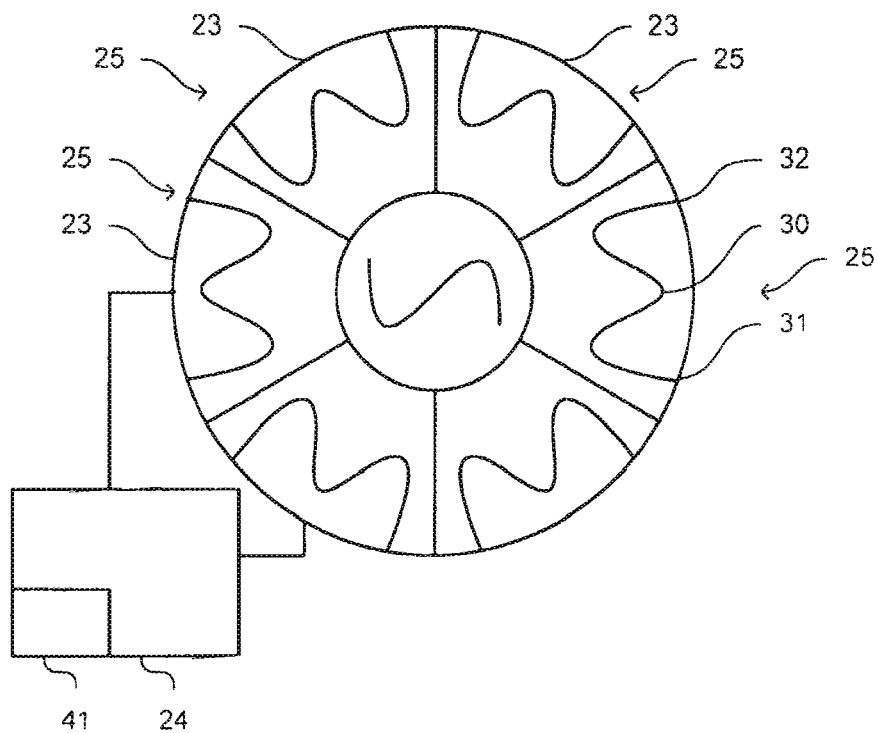
FIG. 9 depicts, in plan view, a part of a support table that may be used with an embodiment of the invention.

Alternatively or additionally, in an embodiment as shown in FIG. 9, the individually controllable conditioning units 23 may each include a channel 30 that follows a path through the support section 22 in the corresponding conditioning region 25. The channel 30 may further include an inlet 31 and an outlet 32 such that a conditioning fluid may be provided to pass through the channel 30. Each channel 30 may have a respective inlet 31 and outlet 32, as shown in FIG. 9. Alternatively, the channels 30 may share a common inlet 31 and outlet 32 such that a single supply of conditioning fluid is provided to the channels 30 in parallel. In this case appropriate valving may be provided to independently control the flow of conditioning fluid in each channel. The conditioning fluid may be conditioned by an appropriate heater and/or cooler (not shown) provided for each independently controllable conditioning unit 23 in order to provide heat energy to and/or remove heat energy from the conditioning region 25.

Figure 10:
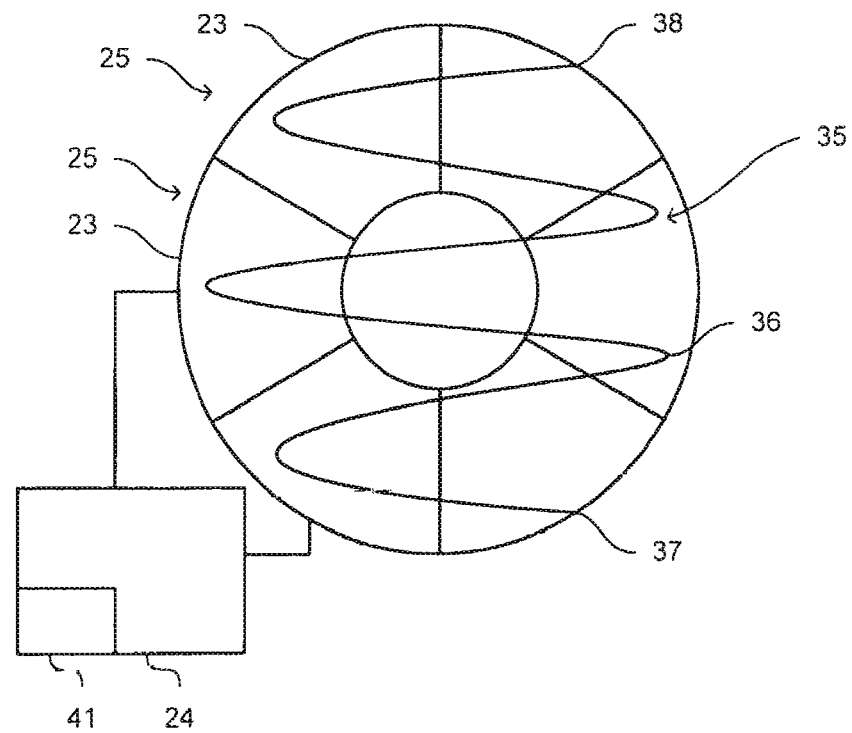
FIG. 10 depicts, in plan view, a part of a support table that may be used with an embodiment of invention.

In an embodiment, as depicted in FIG. 10, the conditioning system 21 may include a global conditioning unit 35 in addition to the individually controllable conditioning units 23, regardless of their nature. The global conditioning unit 35 may be configured to supply heat energy to and/or remove heat energy from all of the conditioning regions 25.

In particular, the global conditioning unit 35 may be provided in the form of a channel 36 that follows a path through all of the conditioning regions 25. The channel 36 may be connected to an inlet 37 and an outlet 38 such that conditioning fluid may be provided to pass through the channel 36 of the global conditioning unit 35. The conditioning fluid passing through the channel 36 of the global conditioning unit 35 may be conditioned by an appropriate heater and/or cooler (not shown) in order to supply heat to and/or remove heat from the support section 22, as required. Global conditioning may additionally or alternatively be provided by appropriate control of multiple independently controllable conditioning units 23 such as described above.

The provision of a global conditioning unit 35 in addition to the provision of individually controllable conditioning units 23 may beneficially provide a faster response under certain conditions. Furthermore, if the individually controllable conditioning units 23 each comprise an electric heater 26, as discussed above, it may be desirable to use these in conjunction with a global conditioning unit 35 formed from a channel 36 within the support section 22 that conveys a conditioning fluid. This may be used to remove from the support section 22 excess heat generated by one or more of the individually controllable conditioning units 23.

Furthermore, the additional provision of a global conditioning unit 35 such as that described above may be beneficial because it may increase the rate at which heat is transferred across the support section 22. Accordingly, if there is a localized change in temperature, the global conditioning unit 35 may rapidly transfer heat around the support section 22. By distributing the heat, variations in temperature across the support section 22, and therefore the substrate W, may be reduced or minimized.

As shown in FIG. 8, a plurality of temperature sensors 40 may be provided within the support section 22 of the support table WT. In the case of one or more electric heaters 26 provided at an edge of the support table WT, the plurality of temperature sensors 40 may be arranged in a way similar to as described in U.S. Patent Application Publication No. US2009/0279061, the content of which is hereby incorporated in its entirety by reference. The controller 24 may be configured to use data from the temperature sensors 40 in order to control the conditioning system 21. In an embodiment, at least one temperature sensor may be provided within each conditioning region 25. Accordingly, temperature measurement data for each conditioning region 25 may be used to control each individually controllable conditioning unit 23.

As shown in FIG. 8, in an embodiment, a plurality of temperature sensors 40 distributed across a conditioning region 25 may be provided for some or all of the conditioning regions 25. Data from each of these temperature sensors 40 may be used to control the individually controllable conditioning unit 23 associated with each conditioning region. Accordingly, if there is a localized heat load on one side of the conditioning region 25, the response time may be quicker than an arrangement in which only a single temperature sensor 40 is provided per conditioning region 25. This is because a temperature sensor on the side of the conditioning region 25 that is experiencing the localized heat load will detect a temperature change sooner than a temperature sensor 40 located, for example, at the center of the conditioning region 25.

Alternatively or additionally, multiple temperature sensors 40 may be provided for each conditioning region 25 distributed appropriately across the thickness of the support section 22 of the support table WT. For example, if an electric heater 26 is provided to an upper surface of the support section 22, such as between the burls 20, one temperature sensor 40 may be provided above the electric heater 26, for example on its upper surface, and one temperature sensor 40 may be provided within the support section 22 of the support table WT. The former may provide data that more quickly responds to temperature change at the substrate W while the latter may respond more quickly to temperature change of the support section 22.

Other distributions of the temperature sensors 40 may be appropriate, depending on the arrangement of the conditioning system 21. Furthermore, the distribution of temperature sensors 40 may be different for different conditioning regions 25.

In an embodiment, the controller 24 may include a memory 41 that stores calibration data for each of the temperature sensors 40. Accordingly, the controller 24 may control the conditioning system 21 based on the combination of the measurement data from the temperature sensors 40 and the calibration data for each temperature sensor 40 stored within the memory 41. Accordingly, the calibration data stored in the memory 41 may be used to provide a desired level of accuracy of the temperature data used by the controller 24 to control the conditioning system 21.

The calibration data stored in the memory 41 may need to be updated. Accordingly, the controller 24 may be configured to generate new calibration data or receive it from an external source such as an apparatus specifically configured to perform a calibration process. In either case, the calibration data may be generated by comparison of measurement data from each temperature sensor 40 for one or a plurality of known temperatures of the temperature sensor 40. However, generating such data may be difficult and/or time consuming. In particular, generating such data may require operation of the lithographic apparatus to be suspended. This is undesirable.

In an embodiment, the memory 41 of the controller 24 further stores calibration correction data for each temperature sensor 40. The controller 24 may be configured to control the conditioning system 21 based on the temperature measurement data from each temperature sensor 40, the corresponding calibration data and the corresponding calibration correction data stored in the memory 41.

The controller 24 may be configured to periodically generate the calibration correction data by performing a specific calibration correction data generation process. This process may be performed at any time in which it is expected that the temperature of a plurality of the temperature sensors 40 is substantially the same.

In order to perform the calibration correction data generation process, the controller 24 receives measurement data from each temperature sensor 40 that is subject to the calibration correction data generation process and uses the calibration data stored in the memory 41 to generate temperature data. A mean value for the temperature data for each of the temperature sensors 40 subject to the process is calculated and a deviation from this mean is determined for each of those temperature sensors 40. The calibration correction data for each temperature sensor 40 corresponds to the deviation for each temperature sensor 40 of the measured value based on the current calibration data from the mean value for all of the temperature sensors 40 in the process.

If the temperature of each of the temperature sensors 40 subject to the calibration correction data generation process is the same and the calibration of one temperature sensor has drifted, this drift will be substantially corrected by the calibration correction data for that temperature sensor 40 at the expense of a small error introduced by the calibration correction data for each of the other temperature sensors 40. Accordingly, the calibration correction data may reduce the effect of temperature sensor drift without the requirement to perform a full calibration process. Such temperature sensor drift may occur for known temperature sensors 40.

In practice, provided there is a relatively large sample of temperature sensors 40, the deviation for each temperature sensor 40 from the mean measured temperature value may quite accurately reflect the calibration drift for that temperature sensor 40.

In an embodiment, a calibration correction data generation process such as that discussed above may be performed using the data for each temperature sensor 40 corresponding to a conditioning region 25. Accordingly, the process may be repeated for each conditioning region 25.

Alternatively or additionally, in an embodiment, the process may be performed for the temperature sensors 40 within each conditioning region 25 using data for each of the temperature sensors 40 within that conditioning region 25 and each adjoining conditioning region 25.

Alternatively or additionally, the process may be performed using data from all of the temperature sensors 40 within the support table WT.

The selection of the appropriate strategy for performing the calibration correction data generation process may depend on the number of temperature sensors 40 provided within each conditioning region 25 and/or within the support table WT. In general, the greater the number of temperature sensors 40 used, the more accurate the calibration correction data for each temperature sensor 40, provided the actual temperature of each of the temperature sensors 40 is the same. However, by using a greater number of temperature sensors 40, the greater the actual variation in temperature of the temperature sensors 40 across the support table WT. Accordingly, the selection of the strategy may also take into account knowledge of when in the process cycle for a support table WT the calibration correction data generation process is to be performed, as discussed below.

In general, it may be desirable for the calibration correction data generation process to be performed after the largest possible elapsed time from a time point when a known localized heat load is applied to the support table WT. This may reduce or minimize the temperature variation across the support table WT. This in turn may minimize the actual temperature variation between the temperature sensors 40, increasing the accuracy of the calibration correction data generation process.

The calibration correction data generation process may be performed relatively quickly, at least in comparison to a process to generate calibration data. Furthermore, the process may be performed while other actions are taking place, including, for example, while the support table WT is in motion, provided that the other actions do not introduce a localized heat load on the support table WT.

In an embodiment, a calibration correction data generation process may be performed when the support table WT is provided at a location within the lithographic apparatus at which a substrate W is removed from and/or loaded onto the support section 22.

Alternatively or additionally, the calibration correction data generation process may be performed when the support table WT is provided to a location within the lithographic apparatus at which one or more metrology processes are performed including, for example an inspection of a substrate W that has been loaded onto a support table WT.

In general, the calibration correction data generation process may be performed at one or more of a number of times in a process cycle, when the fluid handling structure of an immersion lithographic apparatus is not providing immersion fluid to an area on an upper surface of a substrate W supported by the support table WT.

As discussed above, the conditioning system 21 may include a plurality of conditioning regions 25 and the conditioning system 21 may be controlled to control independently the conditioning applied within each of the conditioning regions 25.

Figure 11:
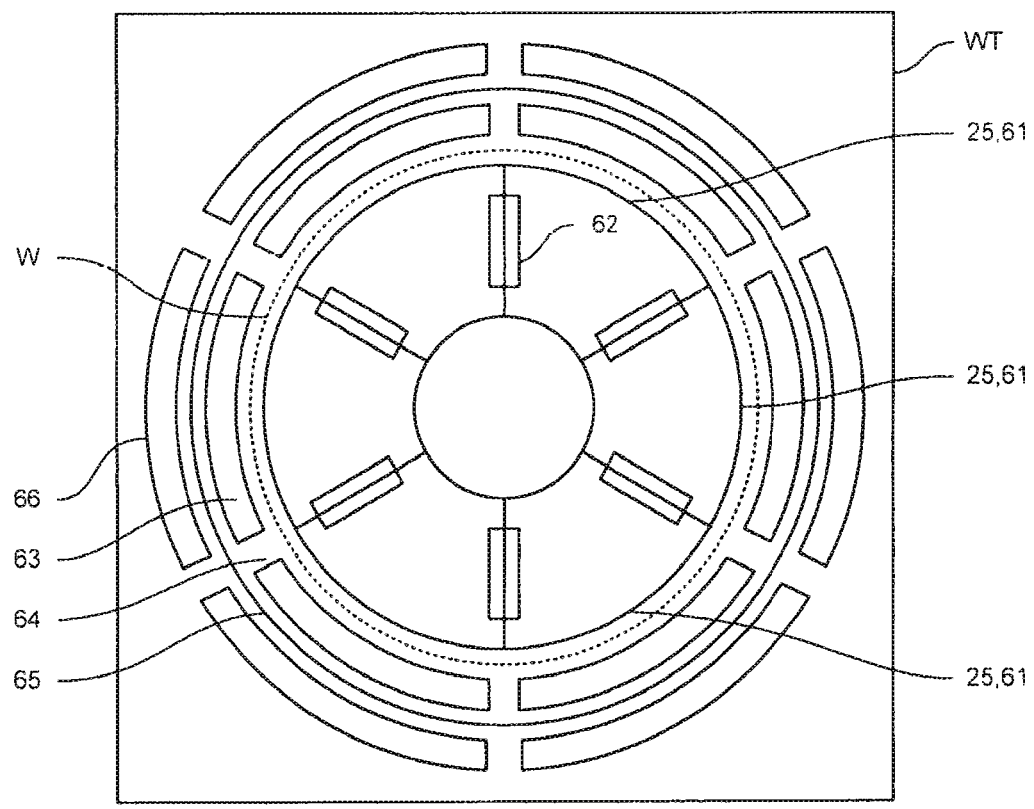
FIG. 11 depicts, in plan view, a support table that may be used with an embodiment of the invention.

In an embodiment, as depicted in FIG. 11, the support section 22 of the support table WT may additionally be formed from separate support table sections 61 that are mechanically connected to adjacent support table section 61 by connectors 62. This may, for example, facilitate the manufacture of a support section 22 in which individually controllable conditioning units 23 are provided. For example, this may facilitate the manufacture of a support table WT having a plurality of conditioning regions 25, each having a separate channel 30 through which conditioning fluid may be provided in order to condition that conditioning region 25 independently, as discussed above.

Alternatively or additionally, in an embodiment as also depicted in FIG. 11, the support table WT may include multiple independent edge extraction units 63. Such edge extraction units 63 may be provided to extract immersion fluid, and gas bubbles that may be included within the immersion fluid, from a gap 64 between the edge of a substrate W and the edge of a recess 65 within the support table WT in which the substrate W is supported. The extraction unit 63 may be provided to reduce or minimize the likelihood of bubbles escaping from the gap 64 into the immersion fluid in the space between the final element of the projection system PS and the substrate W. However, operation of the extraction unit 63 may create a local heat load, in particular may result in cooling. By providing multiple independently controllable extraction units 63 around the edge of the support section 22 of the support table WT, the extraction process may only be performed where and/or when necessary. This may reduce the total heat load on the substrate W. Although in the embodiment depicted in FIG. 11 the number of separate extraction units 63 corresponds to the number of conditioning regions 25 other than the central conditioning region 25, this need not be the case and any number of independently controllable extraction units 63 may be provided.

Alternatively or additionally, in an embodiment, a plurality of independently controllable heaters 66 may be provided adjacent to the gap 64, the gap 64 being between the edge of the substrate W and the edge of the recess 65 in which the substrate W is supported. Such heaters 66 may be provided and controlled to compensate for the cooling caused by the extraction unit 63. Accordingly, if a plurality of extraction units 63 are provided, a corresponding heater 66 may be provided and controlled to operate in unison with the adjacent extraction unit 63.

However, alternative arrangements may be used. For example, a plurality of independently controllable heaters 66 may be provided even if a single extraction system 63 is provided. In any case, a single independently controllable heater 66 may be associated with a plurality of independently controllable extraction units 63 or a plurality of independently controllable heaters 66 may be provided for each independently controllable extraction unit 63.

The one or more extraction units 63 and the one or more heaters 66 may be controlled by the controller 24 used to control the conditioning system 21. Alternatively, one or more additional controllers may be provided.

In an embodiment, there is provided a support table, for a lithographic apparatus, configured to support a substrate, the support table comprising: a support section, configured to support a lower surface of a substrate on an upper face thereof; and a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section and each of the conditioning regions configured such that it corresponds to a section of the upper face of the support section having an area within a range of from approximately 50% to approximately 350% of the area of the substrate in contact with an immersion fluid provided by a fluid handling structure and having an aspect ratio of between 1 and approximately 2.

In an embodiment, each of the conditioning units comprises an electric heater. In an embodiment, each of the conditioning units comprises a channel within the corresponding conditioning region, the channel configured to convey a conditioning fluid and connected to an inlet to provide the conditioning fluid and an outlet for exhausting the conditioning fluid. In an embodiment, the conditioning system further comprises a global conditioning unit, configured to supply heat energy to and/or remove heat energy from all of the conditioning regions. In an embodiment, the global conditioning unit comprises a channel, configured to convey a conditioning fluid to pass through each of the conditioning regions and is connected to an associated inlet to provide the conditioning fluid and outlet for exhausting the conditioning fluid. In an embodiment, the support table further comprises a plurality of temperature sensors, each sensor configured to measure the temperature of the support table at a respective location; and a controller, configured to control the conditioning system, the controller configured to control the conditioning system based on the measurement data from the temperature sensors.

In an embodiment, there is provided a support table, for a lithographic apparatus, configured to support a substrate, the support table comprising: a support section, configured to support a lower surface of a substrate on an upper face thereof; a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section; a plurality of temperature sensors, configured to measure the temperature of the support table at a respective location; and a controller, configured to control the conditioning system based on the measurement data from the temperature sensors.

In an embodiment, at least one temperature sensor is provided to each conditioning region. In an embodiment, a plurality of temperature sensors are provided to each conditioning region. In an embodiment, the controller comprises a memory, configured to store calibration data for each of the temperature sensors. In an embodiment, the controller is configured to generate or receive revised calibration data based on a calibration test, in which a temperature sensor provides measurement data when the temperature sensor is at a known temperature. In an embodiment, the controller is configured to store calibration correction data for each temperature sensor; and the controller is configured to control the conditioning system based on measurement data from the temperature sensors, the corresponding calibration data and the corresponding calibration correction data. In an embodiment, the controller is configured to generate the calibration correction data by performing a calibration correction data generation process comprising: substantially simultaneously obtaining measurement data from a plurality of the temperature sensors; determining temperature data for each temperature sensor based on the measurement data and the calibration data for each temperature sensor; determining for each temperature sensor a deviation of its temperature data from the mean temperature data for the plurality of temperature sensors; and storing calibration correction data for each temperature sensor that corresponds to the determined deviation. In an embodiment, the calibration correction data generation process is performed using measurement data from all of the temperature sensors within a conditioning region of the support section. In an embodiment, the calibration correction data generation process is performed using measurement data from all of the temperature sensors within the support section. In an embodiment, the calibration correction data generation process is performed when a fluid handling structure is not providing immersion fluid to an area on an upper surface of a substrate supported by the support table. In an embodiment, the calibration data generation process is performed when the support table is at a location in a lithographic apparatus at which at least one of the following occurs: the substrate is unloaded from the support table; the substrate is loaded to the support table; and/or the substrate supported by the support table is inspected by a measurement system. In an embodiment, the support table is configured to support the substrate in a recess, and further comprises an extraction system, configured to extract immersion fluid from a gap between the edge of the recess and the edge of the substrate, the extraction system comprising a plurality of independently controllable extraction units, each extraction unit configured to extract immersion fluid from a respective segment of the gap. In an embodiment, the support table further comprises a second conditioning system, configured to supply heat energy to and/or remove heat energy from a region of the support table adjacent a gap between the edge of a recess and the edge of the substrate, the second conditioning system comprising a plurality of independently controllable conditioning units, each configured to supply heat energy to and/or remove heat energy from a respective region of the support table adjacent a respective segment of the gap. In an embodiment, the support section comprises a plurality of support table sections mechanically connected to each other by a connector, each of the support table sections corresponding to a respective conditioning region.

In an embodiment, there is provided a support table, for a lithographic apparatus, configured to support a substrate, the support table comprising: a support section, configured to support a lower surface of a substrate on an upper face thereof; and a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section, wherein each of the conditioning units comprises a channel within the corresponding conditioning region, the channel configured to convey a conditioning fluid.

In an embodiment, at least one selected from the following: the support table further comprises a second conditioning system, configured to supply heat energy to and/or remove heat energy from a region of the support table adjacent a gap between the edge of a recess and the edge of the substrate, the second conditioning system comprising a plurality of independently controllable conditioning units, each configured to supply heat energy to and/or remove heat energy from a respective region of the support table adjacent a respective segment of the gap; the support table further comprises an extraction system, configured to extract immersion liquid from a gap between the edge of a recess and the edge of the substrate, the extraction system comprising a plurality of independently controllable extraction units, each configured to extract immersion liquid from a respective segment of the gap; and/or the support section comprises a plurality of support table sections mechanically connected to each other by a connector, each of the support table sections corresponding to a respective conditioning region.

In an embodiment, there is provided a support table, for a lithographic apparatus, configured to support a substrate in a recess, the support table comprising: a support section, configured to support a lower surface of a substrate on an upper face thereof; a first conditioning system, configured to supply heat energy to and/or remove heat energy from the support section, the first conditioning system comprising a plurality of conditioning units that are independently controllable, each of the conditioning units configured to supply heat energy to and/or remove heat energy from a respective conditioning region of the support section; and a second conditioning system, configured to supply heat energy to and/or remove heat energy from a region of the support table adjacent a gap between the edge of the recess and the edge of the substrate, the second conditioning system comprising a plurality of independently controllable conditioning units, each configured to supply heat energy to and/or remove heat energy from a respective region of the support table adjacent a respective segment of the gap.

In an embodiment, at least one selected from the following: each of the conditioning units comprises a channel within the corresponding conditioning region, configured to convey a conditioning fluid, the channel connected to a respective inlet and outlet; the support table further comprises an extraction system, configured to extract immersion liquid from the gap, the extraction system comprising a plurality of independently controllable extraction units, each configured to extract immersion liquid from a respective segment of the gap; and/or the support section comprises a plurality of support table sections mechanically connected to each other by a connector, each of the support table sections corresponding to a respective conditioning region.

In an embodiment, there is provided a support table, for a lithographic apparatus, configured to support a substrate in a recess, the support table comprising: a support section, configured to support a lower surface of a substrate on an upper face thereof; a conditioning system, configured to supply heat energy to and/or remove heat energy from the support section, the conditioning system comprising a plurality of conditioning units that are independently controllable, each of the conditioning units configured to supply heat energy to and/or remove heat energy from a respective conditioning region of the support section; and an extraction system, configured to extract immersion liquid from a gap between the edge of the recess and the edge of the substrate, the extraction system comprising a plurality of independently controllable extraction units, each configured to extract immersion liquid from a respective segment of the gap.

In an embodiment, each of the conditioning units comprises a channel within the corresponding conditioning region, the channel configured to convey a conditioning fluid and connected to a respective inlet and outlet; the support table further comprises a second conditioning system, configured to supply heat energy to and/or remove heat energy from a region of the support table adjacent the gap, the second conditioning system comprising a plurality of independently controllable conditioning units, each configured to supply heat energy to and/or remove heat energy from a respective region of the support table adjacent a respective segment of the gap; and/or the support section comprises a plurality of support table sections mechanically connected to each other by a connector, each of the support table sections corresponding to a respective conditioning region.

In an embodiment, there is provided a support table, for a lithographic apparatus, configured to support a substrate, the support table comprising: a support section, configured to support a lower surface of a substrate on an upper face thereof, the support section comprising a plurality of support table sections mechanically connected to each other by a connector, each of the support table sections corresponding to a respective conditioning region; and a conditioning system, configured to supply heat energy to and/or remove heat energy from the support section, the conditioning system comprising a plurality of conditioning units that are independently controllable, each of the conditioning units configured to supply heat energy to and/or remove heat energy from its respective conditioning region of the support section.

In an embodiment, each of the conditioning units comprises a channel within the corresponding conditioning region, the channel configured to convey a conditioning fluid and connected to a respective inlet and outlet; the support table further comprises a second conditioning system, configured to supply heat energy to and/or remove heat energy from a region of the support table adjacent a gap between the edge of a recess and the edge of the substrate, the second conditioning system comprising a plurality of independently controllable conditioning units, each configured to supply heat energy to and/or remove heat energy from a respective region of the support table adjacent a respective segment of the gap; and/or the support table further comprises an extraction system, configured to extract immersion liquid therein from a gap between the edge of a recess and the edge of the substrate, the extraction system comprising a plurality of independently controllable extraction units, each configured to extract immersion liquid therein from a respective segment of the gap.

In an embodiment, there is provided a lithographic apparatus, comprising a support table as described herein.

In an embodiment, there is provided a device manufacturing method comprising: projecting a patterned beam of radiation through an immersion liquid provided by a fluid handling structure to a space between a projection system and a substrate supported on an upper surface of a support section of a support table; using a conditioning system to supply heat energy to and/or remove heat energy from the support section, the conditioning system comprising a plurality of conditioning units, each configured to supply heat energy to and/or remove heat energy from a respective conditioning region of the support section, each of the conditioning regions corresponding to a section of the upper face of the support section having an area within a range of from approximately 50% to approximately 350% of the area of the substrate in contact with immersion fluid provided by the fluid handling structure and having an aspect ratio of between 1 and approximately 2; and controlling each of the conditioning units independently.

In an embodiment, there is provided a device manufacturing method comprising: projecting a patterned beam of radiation through an immersion liquid to a space between a projection system and a substrate supported on a support section of a support table; using a conditioning system to supply heat energy to and/or remove heat energy from the support section, the conditioning system comprising a plurality of conditioning units that are independently controllable, each conditioning unit configured to supply heat energy to and/or remove heat energy from a respective conditioning region of the support section; and controlling the conditioning system based on measurement data from a plurality of temperature sensors, each configured to measure the temperature of the support table at a respective location.

In an embodiment, the support section comprises a temperature sensor in each conditioning region. In an embodiment, the control of the conditioning system is based on the measurement data for each temperature sensor and calibration data for each sensor that is stored in a memory. In an embodiment, the calibration data is generated based on a calibration test in which a temperature sensor provides measurement data when the temperature sensor is at a known temperature. In an embodiment, calibration correction data for each temperature sensor is stored in the memory; and the control of the conditioning system is based on the measurement data from the temperature sensors, the corresponding calibration data and the calibration correction data. In an embodiment, the calibration correction data is generated by performing a calibration correction data generation process comprising: substantially simultaneously obtaining measurement data from a plurality of the temperature sensors; determining temperature data for each temperature sensor based on the measurement data and the calibration data for each temperature sensor; determining for each temperature sensor a deviation of its temperature data from the mean temperature data for the plurality of temperature sensors; and storing calibration correction data for each temperature sensor that corresponds to the determined deviation. In an embodiment, the calibration correction data generation process is performed using measurement data from all of the temperature sensors within a conditioning region of the support section. In an embodiment, the calibration correction data generation process is performed using measurement data from all of the temperature sensors of the support section. In an embodiment, the calibration correction data generation process is performed when a fluid handling structure is not providing immersion fluid to an area on an upper surface of a substrate supported by the support table. In an embodiment, the calibration data generation process is performed when the support table is at a location in a lithographic apparatus at which at least one of the following occurs: a substrate is unloaded from the support table; a substrate is loaded to the support table; and/or a substrate supported by the support table is inspected by a measurement system.

In an embodiment, there is provided a method of generating calibration correction data for a plurality of temperature sensors, each configured to measure the temperature of a support table in a lithographic apparatus, the method comprising: substantially simultaneously obtaining measurement data from the temperature sensors; determining temperature data for each temperature sensor based on the measurement data and existing calibration data for each temperature sensor; determining for each temperature sensor a deviation of its temperature data from the mean temperature data for the plurality of temperature sensors; and determining calibration correction data for each temperature sensor that corresponds to the determined deviation.

As will be appreciated, any of the above described features can be used with any other feature and it is not only those combinations explicitly described which are covered in this application. For example, an embodiment of the invention could be applied to the embodiments of FIGS. 2 to 4. Furthermore, discussions herein of heating or heaters should be understood to encompass cooling or coolers, respectively.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A support structure comprising:
   a main body having a first surface on one side of the main body and a second surface on an opposite side of the main body;
   a first plurality of burls projecting from the first surface of the main body, each burl of the first plurality of burls having an end surface to support a substrate;
   a second plurality of burls projecting from the second surface of the main body, each burl of the second plurality of burls having an end surface to support the main body on a structure;
   a heating device located at least partly beneath the first surface and configured to supply heat energy to the support structure and/or substrate;
   a global conditioning unit separate from the heating device and located at least partly beneath the first surface, the global conditioning unit configured to supply heat energy to, and/or remove heat energy from, the support structure and/or substrate and there being horizontal overlap between at least part of the global conditioning unit and at least part of the heating device such that the at least part of the heating device is underneath the at least part of the global conditioning unit or vice versa; and
   an edge heater separate from the heating device and the global conditioning unit, the edge heater arranged so as to be located at or near an edge of the main body and configured to supply heat energy.

2. The support structure of claim 1, wherein the edge heater is arranged so as to be horizontally outward from an edge of the substrate when the substrate is supported on the main body.

3. The support structure of claim 1, comprising a plurality of edge heaters, wherein each of the edge heaters is independently controllable.

4. The support structure of claim 1, wherein the heating device is located at a central portion of the main body and the global conditioning unit spans at least a region outside of the central portion.

5. The support structure of claim 1, wherein the global conditioning unit comprises a channel configured to permit flow therethrough of a heat transfer fluid.

6. The support structure of claim 1, further comprising a plurality of outlets arranged so as to be at or near the edge of the main body, the outlets configured to drain at least a liquid.

7. The support structure of claim 1, wherein the main body is arranged to hold a substrate thereon by suction.

8. A lithographic apparatus comprising:
   the support structure of claim 1; and
   a projection system configured to project radiation onto a substrate supported by the support structure.

9. A support structure comprising:
   a main body having a first surface on one side of the main body and a second surface on an opposite side of the main body;
   a first plurality of burls projecting from the first surface of the main body, each burl of the first plurality of burls having an end surface to support a substrate;
   a second plurality of burls projecting from the second surface of the main body, each burl of the second plurality of burls having an end surface to support the main body on a structure;
   a heat transfer device located at a central portion of the support structure, the heat transfer device configured to at least transfer heat energy to the support structure and/or substrate;
   a channel configured to permit flow therethrough of a heat transfer fluid, the channel extending within the central portion and to at least a region outside of the central portion and there being horizontal overlap between at least part of the channel and at least part of the heat transfer device such that the at least part of the heat transfer device is underneath the at least part of the channel or vice versa; and an edge heater separate from the heat transfer device and the channel, the edge heater arranged so as to be located at or near an edge of the main body and configured to supply heat energy.

10. The support structure of claim 9, wherein the edge heater is arranged so as to be horizontally outward from an edge of the substrate when the substrate is supported on the support structure.

11. The support structure of claim 9, comprising a plurality of edge heaters, wherein each of the edge heaters is independently controllable.

12. The support structure of claim 9, further comprising a plurality of outlets arranged so as to be at or near the edge of the main body, the outlets configured to drain at least a liquid.

13. The support structure of claim 9, wherein the main body is arranged to hold a substrate thereon by suction.

14. A lithographic apparatus comprising:
the support structure of claim 9; and
a projection system configured to project radiation onto a substrate supported by the support structure.

15. A support structure comprising:
a main body having a first surface on one side of the main body and a second surface on an opposite side of the main body, the main body is arranged to hold a substrate thereon by suction;
a first plurality of burls projecting from the first surface of the main body, each burl of the first plurality of burls having an end surface to support the substrate;
a second plurality of burls projecting from the second surface of the main body, each burl of the second plurality of burls having an end surface to support the main body on a structure;
a heat transfer device located at a central portion of the support structure, the heat transfer device configured to at least transfer heat energy to the support structure and/or substrate;
a global conditioning unit separate from the heat transfer device, the global conditioning unit configured to supply heat energy to, and/or remove heat energy from, the support structure and/or substrate and there being horizontal overlap between at least part of the global conditioning unit and at least part of the heat transfer device such that the at least part of the heat transfer device is underneath the at least part of the global conditioning unit or vice versa; and
an edge heater separate from the heat transfer device and the global conditioning, the edge heater arranged so as to be located at or near an edge of the main body and configured to supply heat energy.

16. The support structure of claim 15, wherein the global conditioning unit comprises a channel configured to permit flow therethrough of a heat transfer fluid.

17. The support structure of claim 15, wherein the edge heater is arranged so as to be horizontally outward from the edge of the substrate when the substrate is supported on the support structure.

18. The support structure of claim 15, comprising a plurality of edge heaters, wherein each of the edge heaters is independently controllable.

19. The support structure of claim 15, further comprising a plurality of outlets arranged so as to be at or near the edge of the main body, the outlets configured to drain at least a liquid.

20. A lithographic apparatus comprising:
the support structure of claim 15; and
a projection system configured to project radiation onto a substrate supported by the support structure.

* * * * *